United States Patent
Nakai (10) Patent No.: US 10,339,348 B2
(45) Date of Patent: Jul. 2, 2019

(54) READING DEVICE

(71) Applicant: FUJI CORPORATION, Chiryu-shi (JP)

(72) Inventor: Kenji Nakai, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/549,893

(22) PCT Filed: Feb. 16, 2015

(86) PCT No.: PCT/JP2015/054167
§ 371 (c)(1),
(2) Date: Aug. 9, 2017

(87) PCT Pub. No.: WO2016/132442
PCT Pub. Date: Aug. 25, 2016

(65) Prior Publication Data
US 2018/0032773 A1     Feb. 1, 2018

(51) Int. Cl.
*G06K 7/10*      (2006.01)
*H05K 13/02*     (2006.01)
(Continued)

(52) U.S. Cl.
CPC .......... *G06K 7/10425* (2013.01); *H01L 21/67* (2013.01); *H05K 13/02* (2013.01);
(Continued)

(58) Field of Classification Search
None
See application file for complete search history.

(56) References Cited

U.S. PATENT DOCUMENTS 7,317,393 B2 * 1/2008 Maloney ............ G07C 9/00103
340/568.1
7,895,736 B2    3/2011 Uchino et al.
(Continued)

FOREIGN PATENT DOCUMENTS

EP      1 633 180 A1    3/2006
JP     2006-111445 A    4/2006
(Continued)

OTHER PUBLICATIONS

Extended European Search Report dated Aug. 17, 2018 in European Patent Application No. 15882546.3, 9 pages.
(Continued)

*Primary Examiner* — K. Wong
(74) *Attorney, Agent, or Firm* — Oblon, McClelland, Maier & Neustadt, L.L.P.

(57) ABSTRACT

A reading device including an identification information reading device which reads the identification information, a holding device which holds an identification information application member, a moving device which moves the holding device relative to the identification information reading device, and a control device which controls operations of the identification information reading device, the holding device, and the moving device. The control device causes the holding device to move using the moving device such that at least a portion of the holding region in which the holding device holds the identification information application member is a reading region to move the identification information application member and is configured to perform a first reading process which carries out a reading process of the identification information using the identification information in a state in which holding of the identification information application member using the holding device is released.

5 Claims, 8 Drawing Sheets

(51) Int. Cl.
    *H05K 13/08*        (2006.01)
    *H01L 21/67*        (2006.01)

(52) U.S. Cl.
    CPC ........... *H05K 13/08* (2013.01); *H05K 13/084* (2018.08); *H05K 13/086* (2018.08); *H05K 13/0882* (2018.08)

(56) References Cited

U.S. PATENT DOCUMENTS 8,386,074 B2 *    2/2013    Smith, III ............... G07F 9/006
                                                                                                                        221/96
2006/0032902 A1     2/2006    Kou

FOREIGN PATENT DOCUMENTS

WO    WO 2014/025120 A1    2/2014
WO    WO 2014/049820 A1    4/2014

OTHER PUBLICATIONS

International Search Report dated May 12, 2015, in PCT/JP2015/054167 filed Feb. 16, 2015.

* cited by examiner

READING DEVICE

TECHNICAL FIELD

The technology disclosed in the present description relates to a reading device which reads identification information of an identification information application member to which the identification information is applied.

BACKGROUND ART

PTL 1 (International Publication No. 2006-111445) discloses a reading device for reading an identification tag which is applied to a top portion surface of a tray. The reading device is provided with a tray, a drawer which supports the tray, a tray tower which accommodates multiple drawers, and a tag reader which reads an identification tag. Electric components to be mounted to a circuit board are held in the tray. The tag reader is mounted to the front side (the drawer side of the tray) of the tray tower and the reading direction of the tag reader is the downward direction. By pulling out the drawer which is accommodated in the tray tower from the tray tower, the identification tag on the tray which is pulled out passes under the tag reader. Accordingly, the tag reader reads the identification tag on the tray.

SUMMARY

Technical Problem

As described above, in order to read the identification tag on the tray using this kind of reading device, the tray must be pulled out from the tray tower and caused to pass under the tag reader. Therefore, when the portion to which the identification tag is attached passes under the tag reader, when there is some type of obstruction between the tag reader and the identification tag, there is a case in which the tag reader cannot read the identification tag.

Solution to Problem

A reading device which is disclosed in the present description reads identification information of an identification information application member to which the identification information which indicates a kind of component to be mounted by a component mounting machine is applied. The reading device is provided with an identification information reading device configured to read the identification information, a holding device configured to hold an identification information application member, a moving device configured to move the holding device relative to the identification information reading device, and a control device configured to control operations of the identification information reading device, the holding device, and the moving device. The control device is configured to cause the identification information application member to move by moving the holding with the moving device such that at least a portion of a holding region in which the holding device holds the identification information application member is in a reading region of the identification information reading device member and to perform a first reading process of performing a reading process of the identification information using the identification information reading device in a state in which holding of the identification information application member by the holding device is released.

In the reading device which is described above, due to the control device performing the first reading process, the identification information reading device is capable of reading at least a portion of the holding region (that is, a region which is held by the holding device and may not be possible to read) of the identification information application member. Therefore, even in a case in which the identification information is applied to the holding region which is held by the holding device, it is possible to improve the likelihood that is possible to read the identification information using the identification information reading device.

DESCRIPTION OF EMBODIMENTS

Hereinafter, the main characteristics of a described embodiment will be listed. The technical elements described are respectively independent technical elements, exhibit technical usefulness on their own or in various combinations and are not limited to the combinations described in the claims at the time of application.

Characteristic 1

A control device may be configured to move a holding device to a preset setting position with respect to an identification information reading device using a moving device, and to perform a second reading process of performing reading of the identification information which is applied to the identification information application member using the identification information reading device in a state in which the holding device holds an identification information application member. In a case in which it is not possible to use the second reading process to read the identification information, the control device may be configured to perform a first reading process. According to this configuration, in a case in which the information is applied outside of the holding region, it is possible to use the second reading process to read the identification information, and in a case in which the information is applied inside of the holding region, it is possible to use the first reading process to read the identification information. Since the first reading process is performed only in a case in which the second reading process cannot be used to perform the reading of the identification information, it is possible to efficiently perform the reading process.

(Characteristic 2)

In a case in which the first reading process cannot be used to read the identification information, the control device may be configured to move the holding device with respect to the identification information reading device using the moving device in a state in which the holding device is in contact with an end surface of the identification information application member such that the holding region passes the reading region of the identification information reading device, and to further perform a third reading process which reads the identification information using the identification information reading device. According to this configuration, since the entirety of the holding region of the identification information application member becomes the reading region of the identification information reading device, it is possible to further improve the probability that it is possible to read the identification information.

(Characteristic 3)

The control device may be provided with a memory section which stores the positional information of the holding device with respect to the identification information reading device when the identification information reading device is able to read the identification information. In a case in which the positional information is stored in the memory section in the first reading process, the control device may drive the moving device to move the holding device based on the stored positional information. According to this configuration, it is possible to efficiently perform the reading of the identification information using the identification information reading device.

The present description discloses a management system which is provided with multiple reading devices and a management device which is connected to be capable of communicating with the multiple reading devices. The management device may be provided with a positional information memory section which stores the positional information of the holding device with respect to the identification information reading device when at least one of the multiple reading devices is capable of reading the identification information of the component. In a case in which the positional information is stored in the positional information memory section in the first reading process, each of the control devices of the multiple reading devices may receive the positional information from the management device in which the positional information is stored and drives each of the moving devices based on the positional information to move each of the holding devices. According to this configuration, it is possible to share the positional information of the holding device when it is possible to read the identification information with the multiple reading devices. Accordingly, if it is possible to acquire the positional information using at least one of the reading devices, it is possible to use the positional information on the other reading devices. Therefore, it is possible to efficiently perform the reading of the identification information in each of the reading devices.

Example

Figure 1:
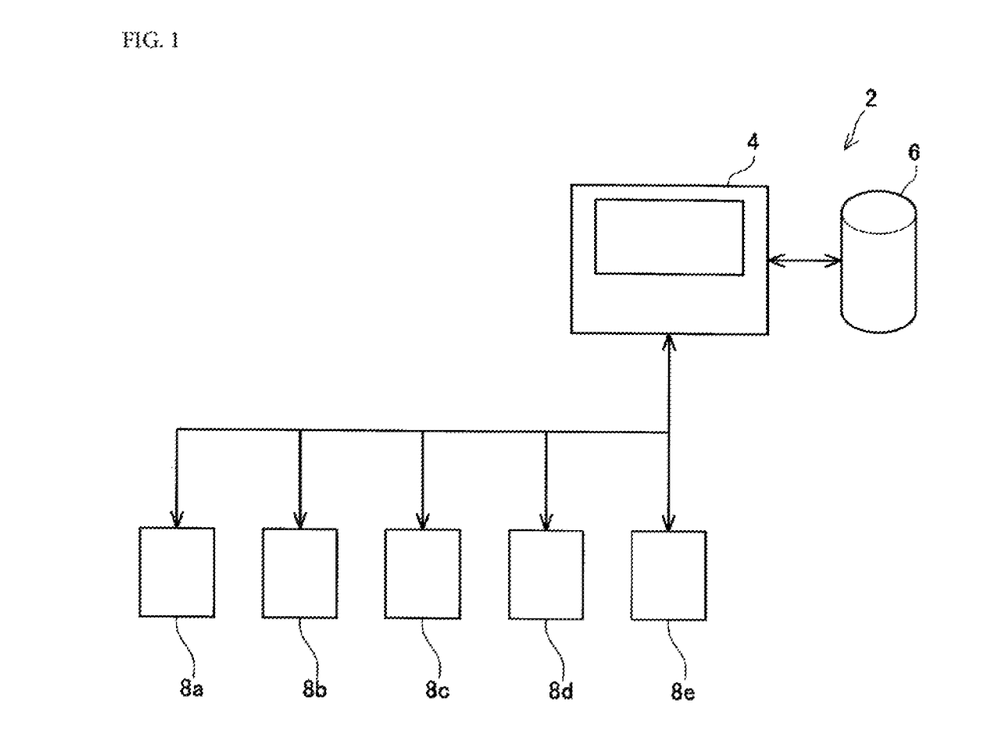
FIG. 1 is a block diagram schematically illustrating multiple component supply devices which include a reading device according to an embodiment, and a management system which manages the component supply devices.

Hereinafter, description will be given of management system 2 according to the present embodiment. As illustrated in FIG. 1, management system 2 is provided with management device 4, data server 6, and multiple component supply devices 8a to 8e. Management device 4 is connected to be capable of communicating with data server 6 and the multiple component supply devices 8a to 8e. Data server 6 is a device which stores various electronic data. Management device 4 performs processes such as the addition, confirmation, editing, and deletion of electronic data which is stored in data server 6 based on information which is transmitted from component supply devices 8a to 8e. The multiple component supply devices 8a to 8e have the same configuration. Hereinafter, in a case in which it is not necessary to distinguish between the multiple component supply devices 8a to 8e, the notation "component supply device 8" will be used.

Figure 2:
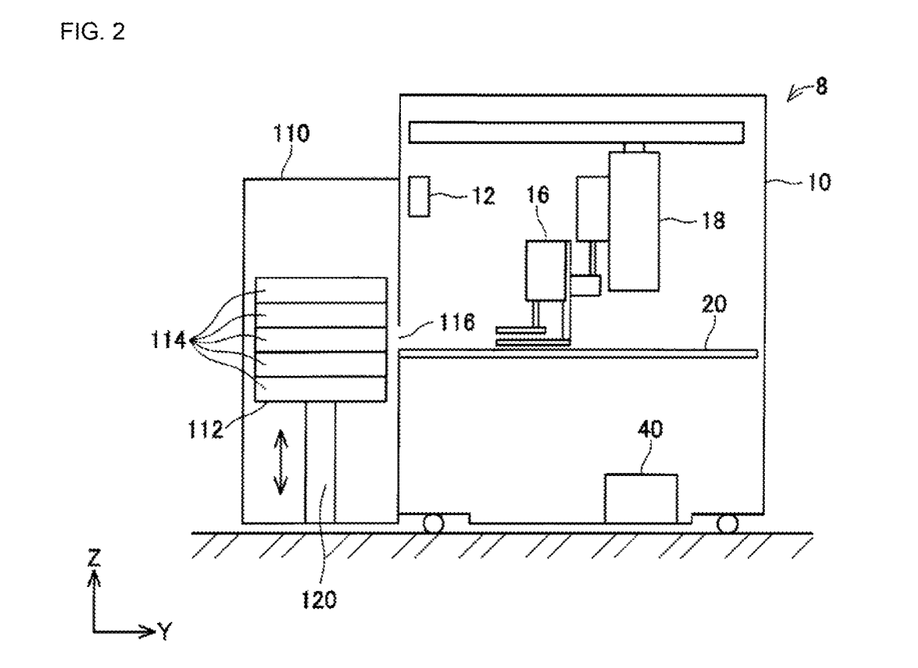
FIG. 2 is a side view schematically illustrating the configuration of the component supply device of the embodiment.

As illustrated in FIG. 2, component supply device 8 is provided with replenishing section 110 and reading section 10. A component mounting machine (not illustrated) is set on the front (the right direction in the diagram) of component supply device 8. The component mounting machine mounts chip 28 which is supplied from component supply device 8 onto a circuit board which is inside the component mounting machine. It is possible to use a well-known component mounting machine for the component mounting machine.

Replenishing section 110 is provided with magazine 112 and lifting and lowering mechanism 120. Magazine 112 is provided with multiple wafer frame accommodation sections 114 which accommodate wafer frames 22. The multiple wafer frame accommodation sections 114 are stacked in the height direction (the Z-direction in the diagrams). Replenishing section 110 supplies wafer frames 22 which are accommodated in wafer frame accommodation sections 114 to reading section 10.

Lifting and lowering mechanism 120 lifts and lowers magazine 112 which is disposed on the upper face of lifting and lowering mechanism 120 upward and downward and stops the magazine 112 at a given height. It is possible to use a well-known mechanism with which a component supply device is equipped for lifting and lowering mechanism 120. For example, lifting and lowering mechanism 120 may be configured using a ball screw, a motor which rotates the ball screw, and the like. When wafer frame accommodation section 114 is positioned at a preset pickup position by lifting and lowering mechanism 120, it is possible to carry out wafer frame 22 from wafer frame accommodation section 114, through carry-out port 116, to reading section 10.

Reading section 10 is provided with identification information reading device 12, clamper 16 which grips wafer frame 22, moving device 18 which moves clamper 16 relative to identification information reading device 12, wafer frame conveyance path 20, and control device 40. Identification information reading device 12 is disposed in the vicinity of carry-out port 116 of replenishing section 110 and above wafer frame conveyance path 20. Identification information reading device 12 is disposed with the reading surface thereof facing downward. Identification information reading device 12 is capable of reading identification information 30 on the upper face of wafer frame 22.

Moving device 18 moves clamper 16 in the X-direction and the Y-direction. Clamper 16 clamps wafer frame 22 which is accommodated in the wafer frame accommodation section. Wafer frame conveyance path 20 extends from replenishing section 110 toward the component mounting machine (not illustrated). Due to moving device 18 moving clamper 16, wafer frame 22 which is clamped by clamper 16 is conveyed along wafer frame conveyance path 20 and is conveyed from replenishing section 110 to the component mounting machine. As described above, the reading surface of identification information reading device 12 faces downward. Therefore, when clamper 16 conveys wafer frame 22, it is possible to read the upper face of wafer frame 22 when wafer frame 22 passes under identification information reading device 12.

Control device 40 is configured using a computer which is provided with a CPU, a ROM, and a RAM. Control device 40 controls operations of the elements of component supply device 8 (identification information reading device 12, clamper 16, moving device 18, and lifting and lowering mechanism 120).

Figure 3:
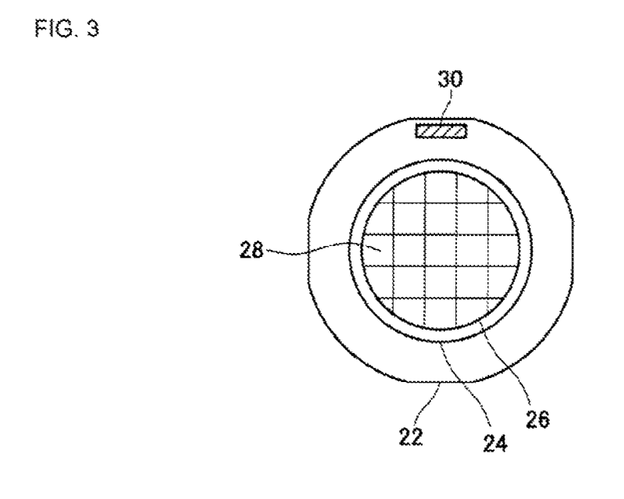
FIG. 3 is a top view of a wafer frame.

Next, description will be given of wafer frame 22 using FIG. 3. Wafer frame 22 is a frame which fixes a wafer 26 during dicing. Dicing sheet 24 is disposed on the upper face of wafer frame 22. Dicing sheet 24 is supported on the upper face of wafer frame 22 by a support member (not illustrated) which is disposed in the periphery of dicing sheet 24. The upper face of dicing sheet 24 is adhesive and wafer 26 adheres to the upper face. Wafer 26 is diced and divided into multiple chips 28. Identification information 30 which indicates the type of chips 28 is applied to the upper face of wafer frame 22 in a region in which dicing sheet 24 is not disposed. A bar code, a two-dimensional code, or the like may be used for identification information 30. It is preferable that the position at which identification information 30 is applied to the upper face of wafer frame 22 be set to the same position in the design in a case in which the size of wafer frame 22 is the same. Component supply device 8 determines the type of wafer 26 (the type of chip 28) to be supplied by reading identification information 30 on the upper face of wafer frame 22 using identification information reading device 12.

Figure 4:
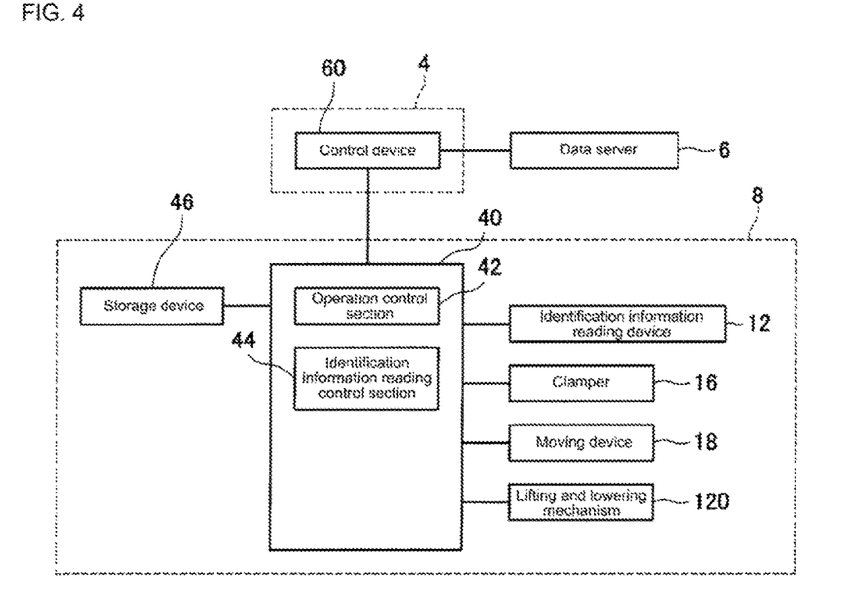
FIG. 4 is a block diagram illustrating the configuration of a control system of the component supply device.

FIG. 4 is a block diagram illustrating the electrical configuration of management system 2 and component supply device 8. Component supply device 8 is provided with control device 40 and storage device 46 which is connected to control device 40. Control device 40 is connected to control device 60 of management device 4 and performs transmission and reception of data with management device 4. Storage device 46 stores an operation program and positional information p(x, y) for controlling the operation of the component supply device 8. The positional information p(x, y) is information indicating a position p(x, y) of clamper 16 when identification information reading device 12 succeeds in reading identification information 30 on the upper face of wafer frame 22. Control device 40 performs the operation program which is stored in storage device 46 to control lifting and lowering mechanism 120, clamper 16, moving device 18, and identification information reading device 12. In other words, control device 40 controls lifting and lowering mechanism 120 to adjust the position of wafer frame accommodation section 114. Control device 40 controls clamper 16 and moving device 18 to adjust the position of wafer frame 22. Control device 40 reads identification information 30 on the upper face of wafer frame 22, which is subjected to positional adjustment, using identification information reading device 12. When the reading of the identification information 30 is successful, control device 40 transmits the positional information p(x, y) of clamper 16 of when the reading is successful to storage device 46 and management device 4. Therefore, control device 40 functions as operation control section 42 and identification information reading control section 44 by performing the operation program.

Figure 5:
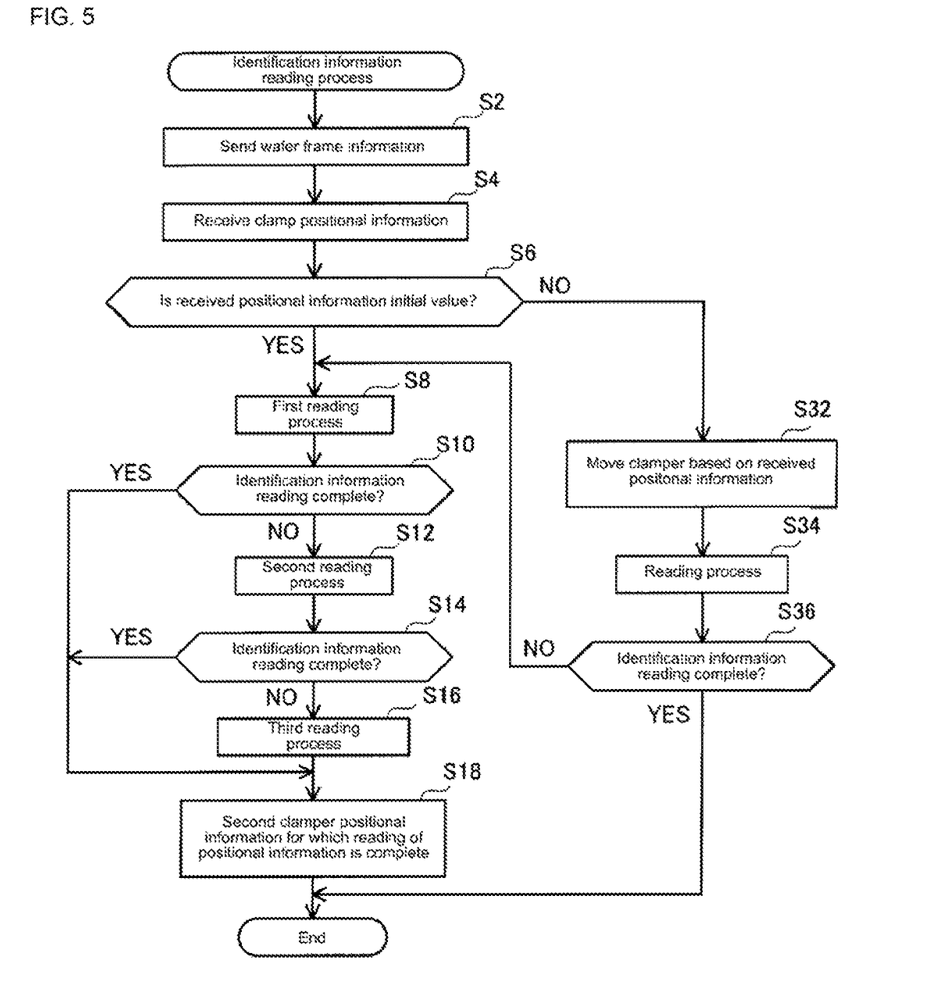
FIG. 5 is a diagram illustrating a flowchart of an identification information reading process.

FIG. 5 is a flowchart of an identification information reading process which is performed by control device 40. In step S2, control device 40 transmits the information of wafer frame 22 to be supplied from replenishing section 110 to reading section 10 to control device 60 of management device 4. The component information is, for example, the type, the size, and the like of the component. When control device 60 receives the information of wafer frame 22 from control device 40, control device 60 acquires positional information $p_1$ ($x_1$, $y_1$) corresponding to the received information (the information of wafer frame 22) from data server 6. Next, control device 60 transmits the positional information $p_1$ ($x_1$, $y_1$) which is acquired from data server 6 to control device 40. At the time at which the multiple component supply devices 8*a* to 8*e* start production, an initial value (for example, p1 (0, 0)) is stored in data server 6 as the positional information $p_1$ ($x_1$, $y_1$). As described later, when the reading of identification information 30 is performed by performing the reading process using control devices 40 of the multiple component supply devices 8*a* to 8*e*, the positional information $p_1$ ($x_1$, $y_1$) is updated accordingly. Therefore, it is possible to determine whether the reading of identification information 30 is successful by whether the positional information $p_1$ ($x_1$, $y_1$) is the initial value.

Next, in step S4, control device 40 receives the positional information $p_1$ ($x_1$, $y_1$) which is transmitted from control device 60. Next, in step S6, control device 40 determines whether the positional information $p_1$ ($x_1$, $y_1$) which is received from control device 60 is the initial value. In a case in which it is determined that the positional information $p_1$ ($x_1$, $y_1$) is the initial value (YES in S6), control device 40 proceeds to step S8. The case in which the positional information $p_1$ ($x_1$, $y_1$) is determined to be the initial value (YES in S6) is a case in which the reading process of identification information 30 on the upper face of wafer frame 22 is not successful in any of the multiple component supply devices 8*a* to 8*e*. Meanwhile, in a case in which it is determined that the positional information $p_1$ ($x_1$, $y_1$) is not the initial value (NO in S6), control device 40 proceeds to steps S32, S34, and S36 and continues the reading process which is based on the positional information $p_1$ ($x_1$, $y_1$). In other words, in step S32, control device 40 uses moving device 18 to move wafer frame 22 based on the positional information $p_1$ ($x_1$, $y_1$). Next, in step S34, control device 40 carries out the reading process of identification information 30 using identification information reading device 12. Next, in step S36, control device 40 determines whether the reading process of identification information 30 of wafer frame 22 has been completed by the reading process of S34. In a case in which the reading of identification information 30 has been completed in the reading process of S36 (YES in S36), control device 40 ends the identification information reading process. In a case in which the reading of identification information 30 has not been completed in the reading process of S36 (NO in S34), control device 40 proceeds to step S8.

Figure 6A:
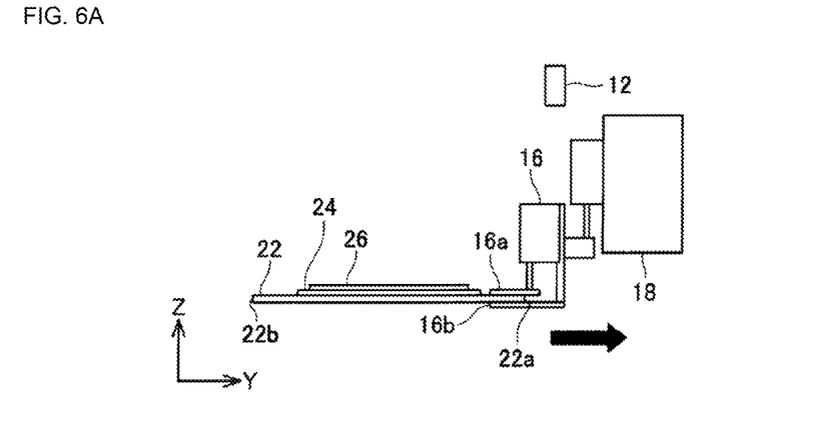
FIG. 6A is a diagram illustrating a state of the reading device when the reading process is started.
Figure 6B:
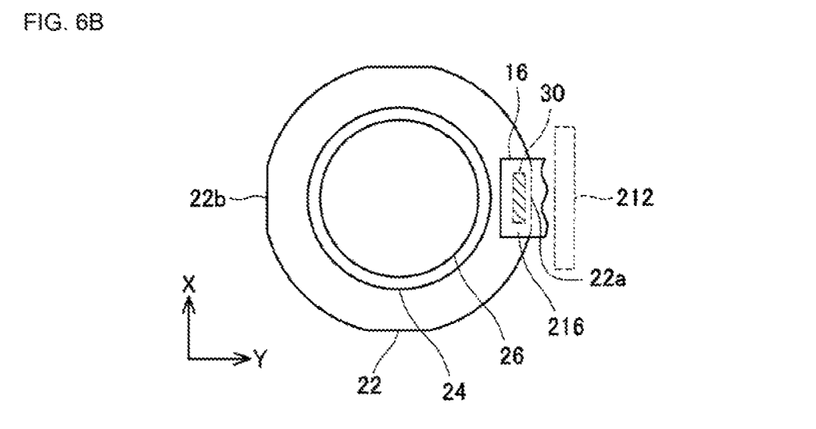
FIG. 6B is a top view of the wafer frame in the state of FIG. 6A.

Next, in step S8, control device 40 carries out the first reading process. Description will be given of the first reading process using FIGS. 6A to 6D as examples. First, control device 40 closes clamp section 16a of clamper 16 to grip the end portion of wafer frame 22 (for example, refer to FIG. 6A). In the state illustrated in FIG. 6A, as illustrated in FIG. 6B, identification information 30 on the upper face of wafer frame 22 is applied to the vicinity of end 22a of wafer frame 22. Therefore, the upper face of identification information 30 is covered by gripping region 216.

Figure 6C:
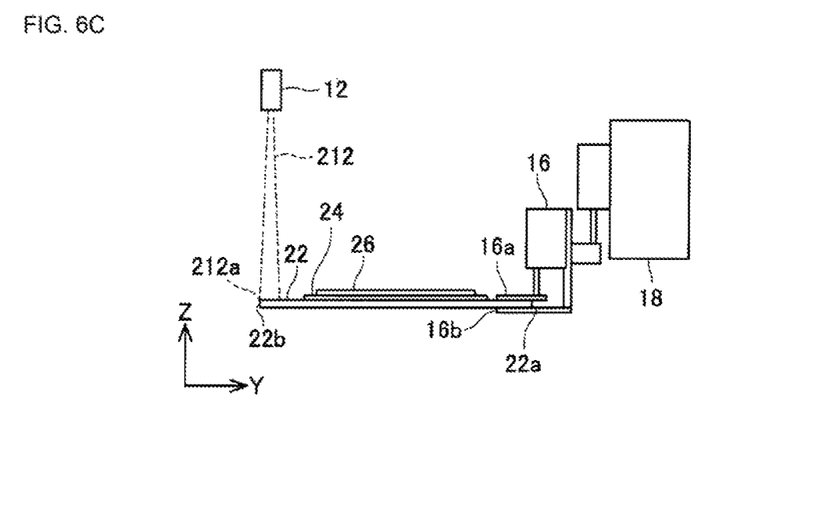
FIG. 6C is a diagram illustrating a state in which an end of the wafer frame and an end of the reading device are aligned.
Figure 6D:
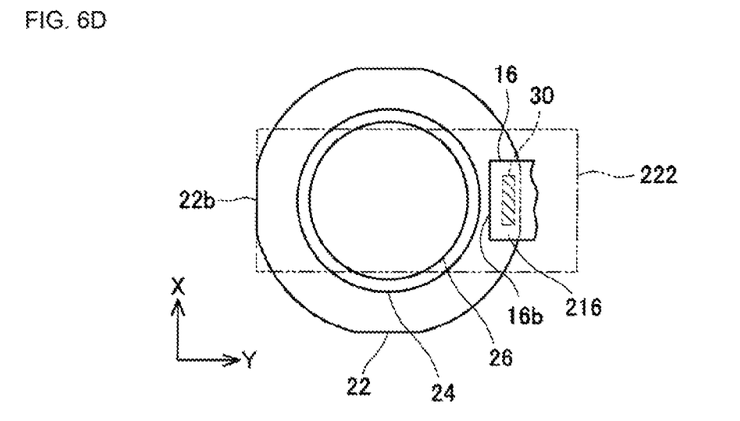
FIG. 6D is a top view of the wafer frame in the state of FIG. 6C.

Next, control device 40 drives moving device 18 in a state in which the end portion of wafer frame 22 is gripped by clamper 16 to move clamper 16 to a preset setting position. Specifically, control device 40 moves wafer frame 22 to a position at which end 22b (specifically, a position of the Y-direction) of wafer frame 22 matches end 212a (specifically, a position of the Y-direction) of reading region 212 of identification information reading device 12 (refer to FIG. 6C). By performing such a process, identification information reading device 12 is capable of reading first reading region 222 (refer to FIG. 6D). In other words, identification information reading device 12 also performs reading while wafer frame 22 is moving under identification information reading device 12 (FIGS. 6A to 6C).

Next, in step S10, control device 40 determines whether the reading process of identification information 30 of wafer frame 22 has been completed by the first reading process. In a case in which the reading of identification information 30 has been completed in the first reading process (YES in S10), control device 40 proceeds to step S18. A case in which the reading of identification information 30 has been completed in the first reading process is a case in which the position to which identification information 30 is applied is inside first reading region 222 and is outside gripping region 216. In a case in which the reading of identification information 30 is not completed in the first reading process (NO in S10), control device 40 proceeds to step S12. A case in which the reading of identification information 30 is not completed in the first reading process is, for example, a case in which the identification information 30 is applied inside of gripping region 216. In the example illustrated in FIG. 6A, identification information 30 is applied inside of gripping region 216. Therefore, since it is not possible to read identification information 30 in the first reading process, identification information reading device 12 proceeds to step S12.

Figure 7A:
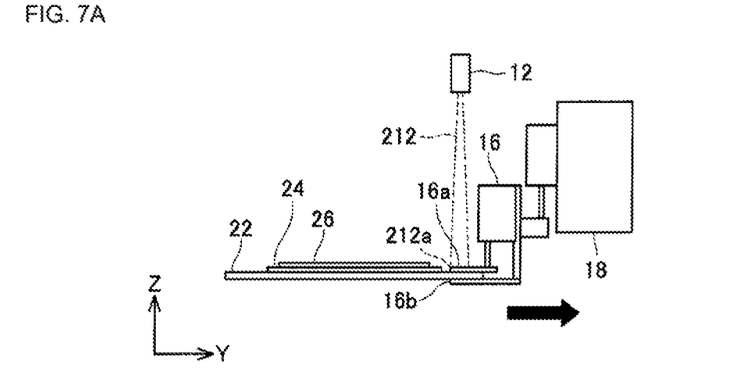
FIG. 7A illustrates a state in which an end of a clamper and an end of a reading region are aligned.
Figure 7B:
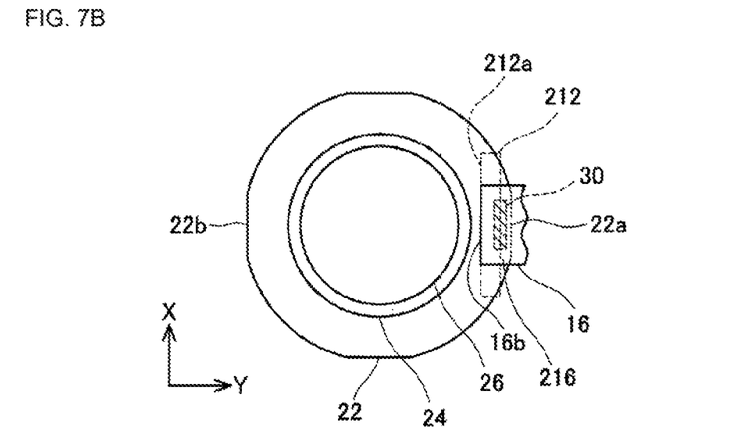
FIG. 7B is a top view of the wafer frame in the state of FIG. 7A.
Figure 7C:
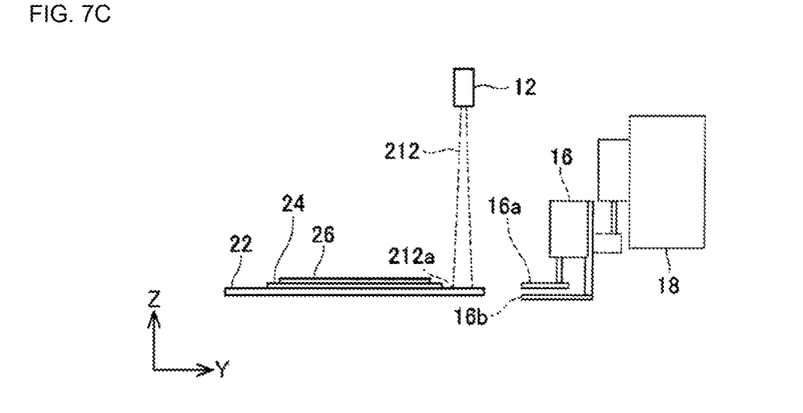
FIG. 7C is a diagram illustrating a state in which the wafer frame is moved such that the clamper is outside of the reading region of the reading device.
Figure 7D:
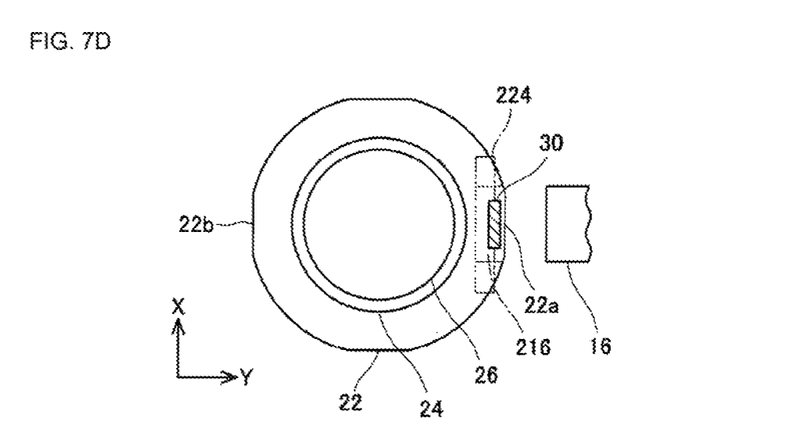
FIG. 7D is a top view of the wafer frame in the state of FIG. 7C.

Next, in step S12, control device 40 performs the second reading process. Description will be given of the second reading process using FIGS. 7A to 7D as examples. First, control device 40 moves clamper 16 to a position at which end 16b of clamper 16 matches end 212a of reading region 212 of identification information reading device 12 in a state in which wafer frame 22 is gripped by clamp section 16a (the state illustrated in FIG. 7A). By doing this, a portion of gripping region 216 overlaps reading region 212 (refer to FIG. 7B). Next, control device 40 releases the gripping of wafer frame 22 by clamp section 16a and moves clamper 16 outside of reading region 212 (the state illustrated in FIG. 7C). Accordingly, identification information reading device 12 is capable of reading a portion (second reading region 224) of gripping region 216 which is covered by clamp section 16a until this point (refer to FIG. 7D). Therefore, there is a case in which identification information reading device 12 is capable of reading identification information 30 even if the position to which identification information 30 is applied is inside gripping region 216.

In step S14, control device 40 determines whether the reading of identification information 30 of wafer frame 22 has been completed by the second reading process. In a case in which the reading of identification information 30 has been completed in the second reading process (YES in S16), control device 40 proceeds to step S18. In a case in which the reading of identification information 30 has not been completed in the second reading process (NO in S14), control device 40 proceeds to step S16. In the example illustrated in FIG. 7D, only a portion of identification information 30 overlaps second reading region 224. Therefore, identification information reading device 12 may not be capable of reading identification information 30 in the second reading process. In such a case, control device 40 proceeds to step S16.

Figure 8A:
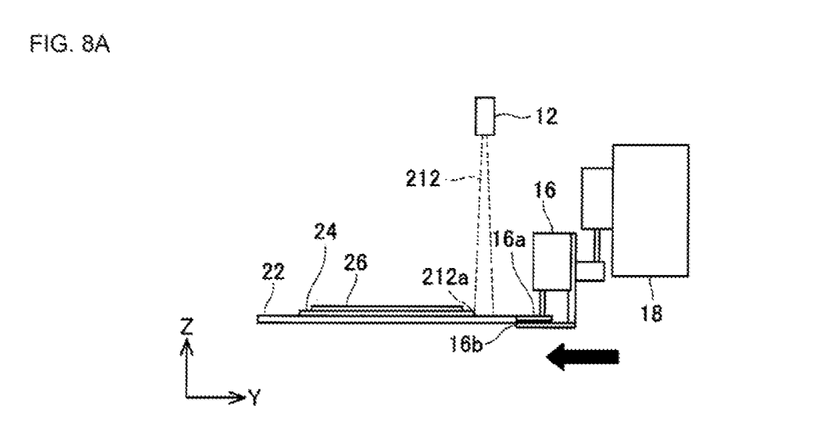
FIG. 8A is a diagram illustrating a state in which the end of the clamper is caused to come into contact with the end of the wafer frame.
Figure 8B:
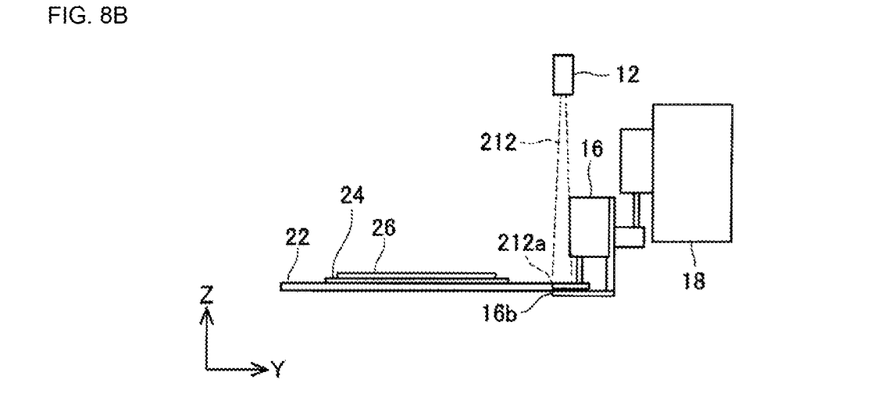
FIG. 8B is a diagram illustrating a state in which the end of the clamper and the end of the reading region are aligned in a state in which the end of the clamper is caused to come into contact with the end of the wafer frame.
Figure 8C:
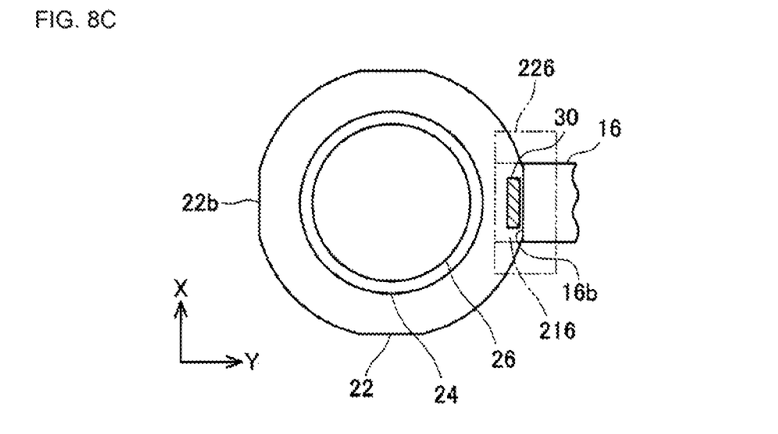
FIG. 8C is a top view of the wafer frame in the state of FIG. 8C.

Next, in step S16, control device 40 performs the third reading process. Description will be given of the third reading process using FIGS. 8A to 8C as examples. First, control device 40 closes clamp section 16a. Next, control device 40 moves clamper 16 such that end 16b of clamper 16 comes into contact with end 22a of wafer frame 22 (the state of FIG. 8A). Since end 16b of clamper 16 is in contact with end 22a of wafer frame 22, when clamper 16 moves, wafer frame 22 also moves. Next, control device 40 moves wafer frame 22 to a position at which end 212a of reading region 212 matches end 22a of wafer frame 22 in a state in which end 16b of clamper 16 is in contact with end 22a of wafer frame 22 (the state of FIG. 8B). Accordingly, third reading region 226 includes all of the regions which are covered by gripping region 216 on the upper face of wafer frame 22 until this point (refer to FIG. 8C). As a result, even in a case in which identification information 30 is applied to gripping region 216 on the upper face of wafer frame 22, control device 40 is capable of reading identification information 30. In a case in which the reading of identification information 30 is completed in the reading processes, control device 40 stores positional information $p_2$ $(x_2, y_2)$ of clamper 16 at this time with respect to identification information reading device 12. Control device 40 also stores the state of clamp section 16a.

Next, in step S18, control device 40 transmits the positional information $p_2$ $(x_2, y_2)$ which is created by reading identification information 30 on the upper face of wafer frame 22 to control device 60. Control device 60 updates the positional information $p_1$ $(x_1, y_1)$ which is stored in data server 6 to the positional information $p_2$ $(x_2, y_2)$ which is received. According to this configuration, the positional information $p_2$ $(x_2, y_2)$ of clamper 16 which is created by reading identification information 30 can be shared by the multiple component supply devices 8a to 8e. Control device 60 may be set to update the positional information $p_1$ $(x_1, y_1)$ with the positional information $p_2$ $(x_2, y_2)$ which is received only in a case in which the reading process of the positional information $p_2$ $(x_2, y_2)$ which differs from the positional information $p_1$ $(x_1, y_1)$ is successful twice in succession.

In step S32 which is performed in the case of NO in S6, control device 40 uses moving device 18 to move wafer frame 22 based on the positional information $p_1$ $(x_1, y_1)$. Accordingly, identification information 30 on the upper face of the wafer frame 22 fits within reading region 212 of identification information reading device 12. Therefore, it is possible to render the movement distance of wafer frame 22 the shortest using control device 40. As a result, every time wafer frame 22 is replenished, it is possible to shorten the time required for the reading of identification information 30 in comparison to a case in which the first to the third reading processes are carried out. As described above, the multiple component supply devices 8 are capable of sharing the positional information $p_1$ ($x_1$, $y_1$) which is stored in data server 6. Accordingly, if it is possible to read the identification information 30 on the upper face of wafer frame 22 using at least one of the component supply devices 8, the other component supply devices 8 are capable of carrying out the reading process based on the positional information $p_1$ ($x_1$, $y_1$) which is stored in data server 6. As a result, it is possible to shorten the time required for the reading process of the multiple component supply devices 8.

In the present example, the reading section is an example of a "reading device". The wafer frame is an example of a "component", and the clamper is an example of a "holding device". The gripping region is an example of a "holding region". The storage device is an example of a "memory section". The first reading process is an example of a "second reading process" and the second reading process is an example of a "first reading process".

Hereinabove, a detailed description is given of examples of the technology which is disclosed in the present description; however, these are merely exemplary and do not limit the claims. The technology described in the claims includes various modifications and changes to the specific examples which are exemplified above.

For example, in the present example, clamper 16 is used to move wafer frame 22. However, even if a suction device or the like is used to move wafer frame 22, it is possible to achieve the same effects as the present embodiment.

The technical elements described in the present description or the drawings exhibit technical usefulness on their own or in various combinations and are not limited to the combinations described in the claims at the time of application. The technology exemplified in the present description or the drawings may be achieved at the same time as a plurality of objects, and the achievement of one of these objects in itself has technical usefulness.

The invention claimed is:

1. A reading device which reads identification information of an identification information application member to which the identification information which indicates a kind of component to be mounted using a component mounting machine is applied, the device comprising:
   an identification information reading device configured to read the identification information;
   a holding device configured to hold the identification information application member;
   a moving device configured to move the holding device relative to the identification information reading device; and
   a control device configured to control operations of the identification information reading device, the holding device, and the moving device,
   wherein the control device is configured to cause the identification information application member to move by moving the holding device with the moving device such that at least a portion of a holding region in which the holding device holds the identification information application member is in a reading region of the identification information reading device and to perform a first reading process of performing reading of the identification information using the identification information reading device in a state in which the identification information application member is released by the holding device, and
   wherein the identification information application member is a wafer frame which holds a wafer and the holding device is a clamper that clamps the wafer frame.

2. The reading device according to claim 1,
   wherein the control device is configured to move the holding device to a preset setting position with respect to the identification information reading device using the moving device, and to perform a second reading process of performing reading of the identification information using the identification information reading device in a state in which the holding device holds the identification information application member, and
   wherein the control device is configured to perform the first reading process when the control device cannot read the identification information by using the second reading process.

3. The reading device according to claim 1,
   wherein when the control device cannot read the identification information using the first reading process, the control device is configured to move the holding device with respect to the identification information reading device using the moving device in a state in which the holding device is in contact with an end surface of the identification information application member such that the holding region passes the reading region of the identification information reading device, and to perform a second reading process which reads the identification information using the identification information reading device.

4. The reading device according to claim 1,
   wherein the control device is provided with a memory section which stores positional information of the holding device with respect to the identification information reading device when the identification information reading device is able to read the identification information, and
   wherein, in a case in which the positional information is stored in the memory section in the first reading process, the control device drives the moving device to move the holding device based on the stored positional information.

5. A management system comprising:
   multiple of the reading devices according to claim 1; and
   a management device which is configured to communicate with the multiple reading devices,
   wherein the management device is provided with a positional information memory section which stores positional information of a holding device with respect to an identification information reading device when at least one of the multiple reading devices is able to read identification information of a component, and
   wherein, in a case in which the positional information is stored in the positional information memory section in the first reading process, each of the control devices of the multiple reading devices receives the stored positional information from the management device and drives each of the moving devices to move each of the holding devices based on the positional information.

* * * * *